(12) United States Patent
Ausserlechner

(10) Patent No.: US 7,620,884 B2
(45) Date of Patent: Nov. 17, 2009

(54) MEMORY CHECKING DEVICE AND METHOD FOR CHECKING A MEMORY

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 558 days.

(21) Appl. No.: 11/278,889

(22) Filed: Apr. 6, 2006

(65) Prior Publication Data

US 2006/0242451 A1    Oct. 26, 2006

(30) Foreign Application Priority Data

Apr. 7, 2005   (DE) .................. 10 2005 016 051

(51) Int. Cl.
G06F 11/10   (2006.01)
H03M 13/00   (2006.01)

(52) U.S. Cl. ..................... 714/804; 714/736

(58) Field of Classification Search ................ 714/804, 714/763, 732, 736, 720
See application file for complete search history.

(56) References Cited

U.S. PATENT DOCUMENTS

| 4,103,823 | A | 8/1978 | Aichelmann, Jr. et al. ... 235/312 |
| 5,862,158 | A * | 1/1999 | Baylor et al. ............... 714/800 |
| 6,871,317 | B1 * | 3/2005 | Corbett ....................... 714/800 |
| 2004/0117723 | A1 | 6/2004 | Foss .......................... 714/805 |
| 2007/0214403 | A1 * | 9/2007 | Longwell et al. ............ 714/800 |

* cited by examiner

*Primary Examiner*—Guy J Lamarre
(74) *Attorney, Agent, or Firm*—Eschweiler & Associates, LLC

(57) ABSTRACT

A memory checking device for cells arranged in memory rows and columns, wherein, in a state of integrity, the memory has parity values for two memory rows or two columns that differ from each other with the same parity value calculation rule or with different parity value calculation rules or are equal with different parity value calculation rules. The checking device includes a reader for reading out the binary memory values of the two memory columns or rows. The memory checking device includes a checking unit designed to calculate the parity value according to the calculation rule valid for the corresponding memory column or row for the two memory columns or the two rows, and to compare it with an expected parity value for the state of integrity, and, in the case of a deviation, to provide an error indication in one of the rows or one of the columns.

25 Claims, 6 Drawing Sheets

FIG 2

| row | 200 | 0 | 1 | 2 | 3 | 4 | 5 |
|---|---|---|---|---|---|---|---|
| 0 | 1 | 0 | 0 | 0 | 1 | 0 | 0 |
| 1 | 0 | 0 | 0 | 0 | 1 | 0 | 1 |
| 2 | 1 | 0 | 0 | 1 | 0 | 0 | 0 |
| 3 | 0 | 0 | 1 | 0 | 0 | 0 | 1 |
| 4 | 1 | 1 | 0 | 0 | 0 | 0 | 0 |
| 5 | 0 | 0 | 0 | 0 | 0 | 0 | 0 |
| 6 | 1 | 1 | 1 | 1 | 1 | 0 | 0 |
| 7 | 0 | 0 | 0 | 1 | 0 | 1 | 0 |
| 8 | 1 | 0 | 0 | 0 | 1 | 0 | 0 |
| 9 | 0 | 0 | 0 | 0 | 1 | 0 | 1 |
| 10 | 1 | 0 | 0 | 1 | 0 | 0 | 0 |
| 11 | 0 | 0 | 0 | 0 | 0 | 0 | 0 |
| 12 | 1 | 0 | 0 | 0 | 0 | 1 | 0 |
| 13 | 0 | 0 | 0 | 0 | 0 | 0 | 0 |
| 14 | 1 | 0 | 0 | 0 | 0 | 1 | 0 |
| 15 | 0 | 1 | 1 | 1 | 1 | 1 | 0 |

FIG 3

| row | 200 | 0 | 1 | 2 | 3 | 4 | 5 | 6 |
|---|---|---|---|---|---|---|---|---|
| 0 | 0 | 1 | 0 | 1 | 0 | 1 | 0 | 1 |
| 0 | 0 | 0 | 0 | 0 | 1 | 0 | 0 | 1 |
| 1 | 1 | 0 | 0 | 0 | 1 | 0 | 0 | 0 |
| 2 | 0 | 0 | 0 | 1 | 0 | 0 | 0 | 1 |
| 3 | 1 | 0 | 1 | 0 | 0 | 0 | 0 | 0 |
| 4 | 0 | 1 | 0 | 0 | 0 | 0 | 0 | 1 |
| 5 | 1 | 0 | 0 | 0 | 0 | 0 | 1 | 0 |
| 6 | 0 | 1 | 1 | 1 | 1 | 0 | 0 | 1 |
| 7 | 1 | 0 | 0 | 1 | 0 | 0 | 0 | 0 |
| 8 | 0 | 0 | 0 | 0 | 1 | 0 | 0 | 1 |
| 9 | 1 | 0 | 0 | 0 | 1 | 0 | 0 | 0 |
| 10 | 0 | 0 | 1 | 0 | 0 | 0 | 0 | 1 |
| 11 | 1 | 0 | 0 | 0 | 0 | 0 | 0 | 1 |
| 12 | 0 | 0 | 0 | 0 | 0 | 0 | 0 | 0 |
| 13 | 1 | 0 | 0 | 0 | 0 | 0 | 0 | 1 |
| 14 | 0 | 0 | 0 | 0 | 0 | 0 | 0 | 0 |
| 15 | 1 | 1 | 0 | 0 | 0 | 0 | 0 | 0 |

FIG 4

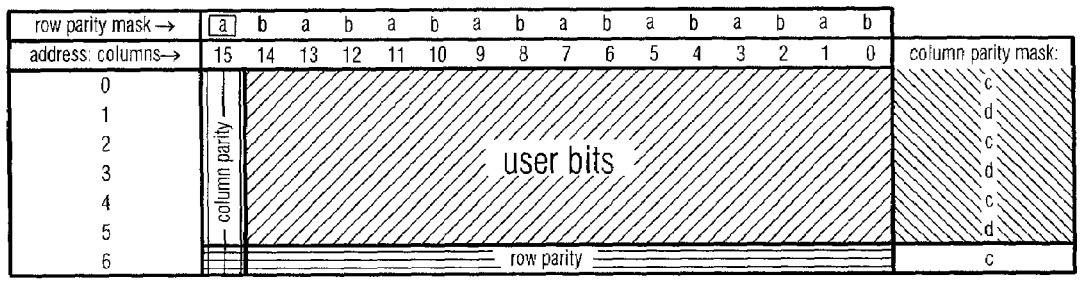

⊕ indicates a modulo 2 addition

1st case: even column number (e.g. 0 ...15) odd row number (e.g. 0 ...6):
□ = odd a ⊕ even b
▨ = odd c ⊕ odd d
→
odd a ⊕ even b ⊕ c =?= odd c ⊕ odd d ⊕ a
→
even a ⊕ even b =?= even c ⊕ odd d
This equation is satisfied for d="0". Then c="1".
Both a="1" AND b="0" and a="0" AND b="1" are possible.
→ for odd rows and even columns, the parity mask in the parity row must be "1".

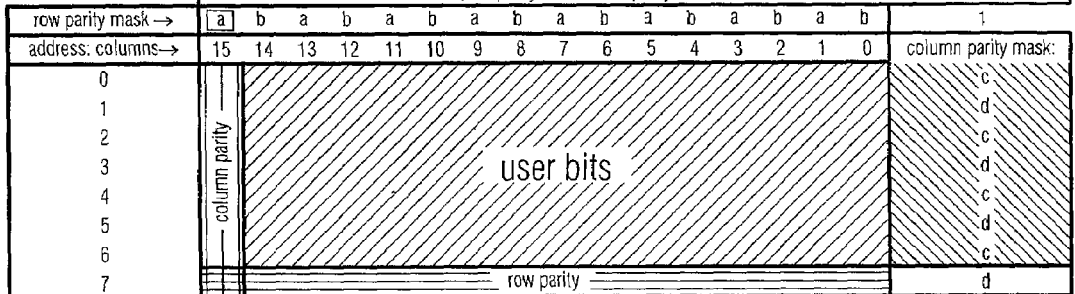

2nd case: even column number (e.g. 0 ...15) even row number (e.g. 0 ...7):
□ = odd a ⊕ even b
▨ = even c ⊕ odd d
→
odd a ⊕ even b ⊕ d =?= even c ⊕ odd d ⊕ a
→
even a ⊕ even b =?= even c ⊕ even d
This equation is always satisfied.
For even column and row numbers, there is no constraint for the alternating parity masks.

FIG 5

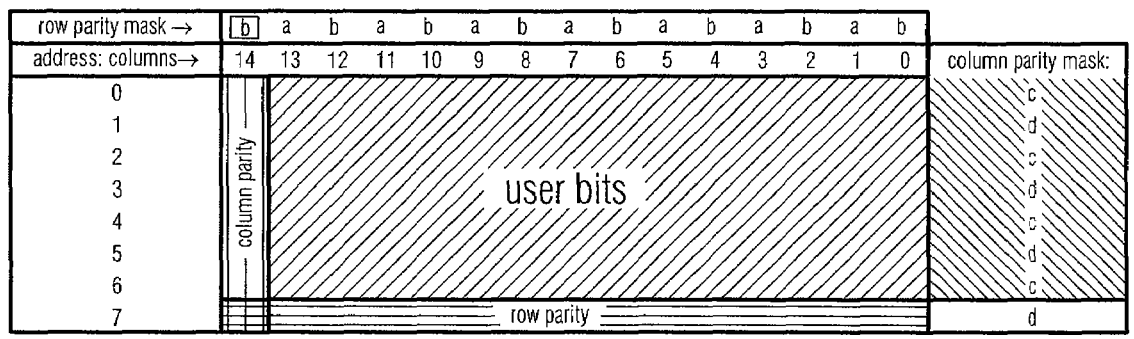

3rd case: odd column number (e.g. 0 ...14) even row number (e.g. 0 ...7):
- ☐ = odd a ⊕ odd b
- ▨ = even c ⊕ odd d →
| odd a ⊕ odd b | ⊕ | d | =?= | even c ⊕ odd d | ⊕ | b |

→
odd a ⊕ even b =?= even c ⊕ even d
This equation is only satisfied for a="0". Therefore b="1".
Both c="1" AND d="0" and c="0" AND d="1" are possible.
For odd columns and even rows, the parity mask in the parity column must be 1.

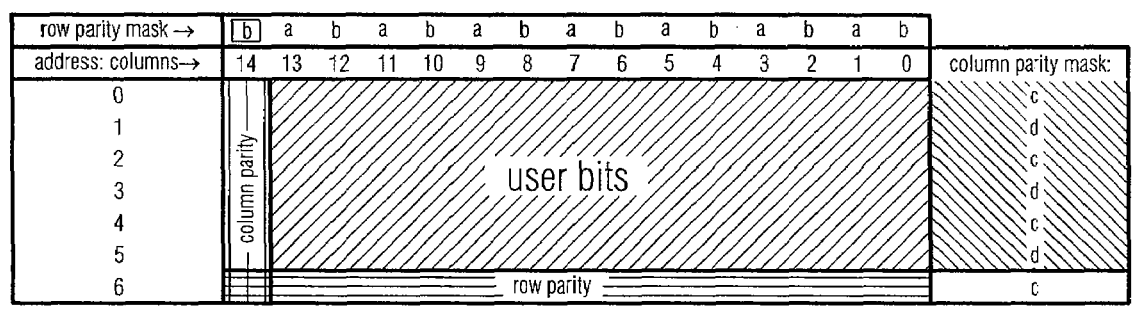

4th case: odd column number (e.g. 0 ...14) odd row number (e.g. 0 ...6):
- ☐ = odd a ⊕ odd b
- ▨ = odd c ⊕ odd d →
| odd a ⊕ odd b | ⊕ | c | =?= | odd c ⊕ odd d | ⊕ | b |

→
odd a ⊕ even b =?= even c ⊕ odd d
1st solution: a=1, b=0, c=0, d=1
2nd solution: a=0, b=1, c=1, d=0     uniform solution: a=d AND b=c

| bit number:=> | 0 | 1 | 2 | 3 | 4 | 5 | 6 | 7 | 8 | 9 | 10 | 11 | 12 | 13 | 14 | 15 | row parity: | # of 1-s/row: |
|---|---|---|---|---|---|---|---|---|---|---|---|---|---|---|---|---|---|---|
| user data addr_i=0 | 0 | 1 | 0 | 1 | 1 | 1 | 1 | 1 | 1 | 1 | 1 | 1 | 1 | 1 | 1 | 1 | 0 | 14 |
| addr_i=1 | 1 | 1 | 1 | 0 | 1 | 0 | 1 | 0 | 1 | 0 | 1 | 0 | 1 | 0 | 1 | 1 | 0 | 10 |
| addr_i=2 | 1 | 0 | 1 | 1 | 0 | 1 | 0 | 1 | 0 | 1 | 0 | 1 | 0 | 1 | 0 | 0 | 0 | 8 |
| addr_i=3 | 0 | 1 | 0 | 0 | 1 | 0 | 1 | 0 | 1 | 0 | 1 | 0 | 1 | 0 | 1 | 1 | 0 | 8 |
| addr_i=4 | 1 | 0 | 1 | 1 | 0 | 1 | 0 | 1 | 0 | 1 | 0 | 1 | 0 | 1 | 0 | 0 | 0 | 8 |
| addr_i=5 | 0 | 1 | 0 | 0 | 1 | 0 | 1 | 0 | 1 | 0 | 1 | 0 | 1 | 0 | 1 | 1 | 0 | 8 |
| addr_i=6 | 1 | 0 | 1 | 1 | 0 | 1 | 0 | 1 | 0 | 1 | 0 | 1 | 0 | 1 | 0 | 0 | 0 | 8 |
| addr_i=7 | 0 | 1 | 0 | 0 | 1 | 0 | 1 | 0 | 1 | 0 | 1 | 0 | 1 | 0 | 1 | 1 | 0 | 8 |
| precal data addr_i=8 | 1 | 0 | 1 | 1 | 0 | 1 | 0 | 1 | 0 | 1 | 0 | 1 | 0 | 1 | 0 | 0 | 0 | 8 |
| addr_i=9 | 0 | 1 | 0 | 0 | 1 | 0 | 1 | 0 | 1 | 0 | 1 | 0 | 1 | 0 | 1 | 1 | 0 | 8 |
| addr_i=10 | 1 | 0 | 1 | 1 | 0 | 1 | 0 | 1 | 0 | 1 | 0 | 1 | 0 | 1 | 0 | 0 | 0 | 8 |
| addr_i=11 | 0 | 1 | 0 | 0 | 1 | 0 | 1 | 0 | 1 | 0 | 1 | 0 | 1 | 0 | 1 | 1 | 0 | 8 |
| addr_i=12 | 1 | 0 | 1 | 1 | 0 | 1 | 0 | 1 | 0 | 1 | 0 | 1 | 0 | 1 | 0 | 0 | 0 | 8 |
| addr_i=13 | 0 | 1 | 0 | 0 | 1 | 0 | 1 | 0 | 1 | 0 | 1 | 0 | 1 | 0 | 1 | 1 | 0 | 8 |
| addr_i=14 | 1 | 0 | 1 | 1 | 0 | 1 | 0 | 1 | 0 | 1 | 0 | 1 | 0 | 1 | 0 | 0 | 0 | 8 |
| column parity:=> | 0 | 0 | 0 | 0 | 0 | 0 | 0 | 0 | 0 | 0 | 0 | 0 | 0 | 0 | 0 | 0 | | |
| # of 1-s/column:=> | 8 | 8 | 8 | 8 | 8 | 8 | 8 | 8 | 8 | 8 | 8 | 8 | 8 | 8 | 8 | 8 | | |

US 7,620,884 B2

MEMORY CHECKING DEVICE AND METHOD FOR CHECKING A MEMORY

PRIORITY

This application claims priority from German Patent Application No. 10 2005 016 051.4, which was filed on Apr. 7, 2005, and is incorporated herein by reference in its entirety.

TECHNICAL FIELD

The present invention relates to the technical field of semiconductor memories, and particularly the present invention relates to the technical sub-field of checking the integrity of semiconductor memories for sensors, such as they are employed in automobile electronics.

BACKGROUND

Modern integrated sensors contain a small data memory of the size of 10 bits to 1000 bits to store the calibrating data of a sensor on the chip therewith. For automotive applications, high reliability is demanded so that it is required to guarantee the integrity of the data with known methods of error detecting and error correcting codes (FEC codes=forward error correcting codes).

Since the memory size is therefore very small as compared to data preservation systems common today and, on the other hand, reasons of economy force designers to implement a system as simple as possible, the matrix parity check is widely used as FEC method. In order to explain the matrix parity check in more detail, a memory 600 is symbolically illustrated in FIG. 6. The memory 600 has a word width of 16 bits, wherein the individual bits of the words are designated by the bit numbers 602, as illustrated in the row above memory 600 in FIG. 6 (i.e. the columns 0 to 15 designate the individual bits of the corresponding words). The memory 600 further includes an address area of 15 words, wherein each word may be written into a row 604, whereby the 15 words in the memory 600 may be addressed by the row address addr_i=0 . . . 14. The division into two data areas (user and precal data) may be ignored here. Row parity bits are stored on the address 0, corresponding column parity bits are stored on the column 15 indicated by the reference numeral 606. Furthermore, the designation "row parity" (reference numeral 608) represents the calculated parity per row (which, however, is not stored, but calculated when reading out a row). Likewise, "column parity" (reference numeral 601) represents the calculated parity per column (which is not stored either, but calculated when reading out the row).

The operation of the above matrix parity check may be described as follows. The calibrating data required for a sensor are programmed into the addresses 1 to 14 and the columns 0 to 14. Each word is provided with a parity bit, which is programmed in the column 15. The parity bit is to be selected so that the number of ones per row is even (=even parity). The parity row—i.e. the totality of all column parity bits—is stored in address 0; it is calculated so that the number of ones per column is also even. It is to be noted here that the parity of all cells of a column (i.e. for the rows 1 . . . 15) is referred to as column parity, and the parity of all cells of a row (i.e. for all columns 0 . . . 15 of a row) is referred to as row parity. In contrast, the row containing no data, but only column parity bits, i.e. which contain redundancy information for error detection and correction (stored in the address 0 in the example), is referred to as parity row. Analogously, the column containing no data, but only row parity bits containing redundancy information for error detection and/or correction (the column with the address 0 in the example) is referred to as parity column.

When reading out the data, the number of ones per column and row is counted. If it is odd, at least one bit in the corresponding row or column must be toggled, as it is illustrated, for example, in FIG. 7 with respect to the bit in column number 7 and row number 10. Technically, counting the number of ones in the whole memory is complicated. Therefore, only the number of ones per column is calculated continuously by combining the bits of a column with an EXCLUSIVE-OR gate (for example in the form of a hard-coded logic). This means that, for example, the bit of address 0, column 7 is combined with the bit of address 1, column 7, the bit of address 2, column 7, . . . , and the bit of address 14, column 7, by an EXCLUSIVE OR operation to achieve the bit in the column parity row (i.e. the bit number 7 of row 610) for column 7. Formally, such an operation may be illustrated as follows:

Bit (address 0, column 7) $\oplus$ bit (address 1, column 7) $\oplus$ . . . $\oplus$ bit (address 14, column 7)=column parity <7>. Here, the symbol $\oplus$ means an XOR operation (=EXCLUSIVE-OR operation) equaling an addition modulo 2. If column parity <7>=0, the number of ones in column 7 is even, i.e. no bit error has been detected in this column.

If column parity <7>=1, the number of ones in column 7 is odd, i.e. a bit error has been detected in this column. When reading out a row—as marked by the highlighted address row 10 in FIG. 7—it is copied into a readout register 612, where all cells of this register are XORed (=EXCLUSIVE-ORed) to calculate the row parity. Formally, such an operation for determining the row parity bit 614 may be described by the following equation:

Row parity=bit <0> $\oplus$ bit <1> $\oplus$ . . . $\oplus$ bit <15>.

Furthermore, FIGS. 6 and 7 also illustrate how, in the case of an error detection (i.e. when row parity=1), a detected error may be corrected automatically. This is done by combining the row parity bit 614 with an error correction enable signal fec_en_i in an AND gate 616, wherein the error correction enable signal assumes a logic value of 1 when a forward error correction is to be performed. The signal resulting from the AND gate 616 is used as input signal of a further AND gate 618 at whose second input the values of the column parity 610 are applied so that, as output signal of the AND gate 618, a 16 bit wide word is output in which the places in the corresponding address row addr_i which are to be corrected are coded with a binary value of 1, while the places not to be corrected are coded with the binary value of 0. This output signal of the AND gate 618 is then supplied as an input signal to an EXCLUSIVE-OR gate 620, at the second input of which the 16 bit wide word from the register 612 is applied. A columnwise EXCLUSIVE-OR operation is performed, wherein the correspondingly toggled bits of the word stored in the register 612 may be corrected.

By way of illustration, it is again repeated that parity actually means the number of ones in a data word. There is even parity when this number is even, otherwise there is odd parity. The memory contents thus consist of payload data and additional parity bits.

In the example described above, the row on address 0 and, in all other addresses, the column 15 were parity bits. The payload data were located in the columns 0 . . . 14 and in the rows 1 . . . 14. The parity calculation includes the payload data plus parity bit plus parity mask.

The properties of the matrix parity check for error detection may be summarized as follows. Detection is guaranteed when one or two bits are toggled; if only one bit toggles, the parity in the respective row and column is not correct, if two bits in different columns and rows are toggled, all columns and rows indicate this by an incorrect parity in the corresponding rows and columns. If two bits in the same row are toggled, the row parity is correct, but the column parity is not. Something analogous also applies to the toggling of two bits in the same column. Even when three bits are toggled, at least one toggled bit is guaranteed to be detected as faulty.

In addition, a single toggled bit may even be corrected automatically, because its position may be determined by the incorrect row and column parity, it may be inverted when read out and thus the original state may be restored (=automatic error correction).

Such a method is thus very well suited to indicate small defects concerning only a few bits and maybe even eliminate them (i.e. when only one bit is toggled). Thus, failures resulting from small defect density problems common today may be eliminated.

However, the above-described method is problematic in that the failure of the whole memory or a sub-area of the memory with an even number of rows and columns may not be detected. In the following, such a sub-area of a memory is referred to as "even block".

Such a failure of an even block may be caused, for example, by a short circuit of all cells of a column to ground (=stuck-at-low) or to operational voltage (=stuck-at-high). It is also conceivable that the reading current for reading out the cells becomes too small or too large due to a defect, which may result in reading out all cells as digital "1" or digital "0". Possibly, the whole memory may unintentionally be programmed to "1" or "0" by an inadmissibly high ESD (electrostatic discharge) or EMV stress (EMV=electromagnetic compatibility).

A possible solution of such problems could be to ensure, by suitable coding of the data to be stored, that the memory contents "all 1" and/or "all 0" are no valid data set, i.e. that these memory contents are never programmed. An evaluating circuit would then have to continuously read out all data in operation and sum up the number of ones and zeros. If they exceed a set limit, this is detected as an error. This evaluating circuit, however, involves a lot of effort, is complicated and error-prone (because it has to perform a large number of operating steps operating sequentially), occupies relatively much space on the chip as compared to the small data memory and is further also inefficient, because it can only detect the completely deleted or set memory, but not the failure of an even block.

SUMMARY

It is the object of the present invention to provide a possibility to detect the failure of a sub-area of a memory in a simple, reliable and inexpensive way to avoid the above problems of prior art.

In accordance with a first aspect, the present invention provides a memory checking device for a memory having memory cells arranged in memory rows and memory columns and having binary memory values, wherein, in a state of integrity, the memory is occupied such that parity values for two memory rows or for two memory columns differ from each other with equal parity value calculation rules or are equal with different parity value calculation rules, wherein the memory checking device includes a checking unit adapted to calculate one parity value each for the two memory columns or the two memory rows according to the calculation rule valid for the corresponding memory column or the corresponding memory row, and to compare it with an expected parity value for the state of integrity.

In accordance with a second aspect, the present invention provides a method for checking a memory having memory cells arranged in memory rows and memory columns and having binary memory values, wherein, in a state of integrity, the memory is occupied such that parity values for two memory rows or for two memory columns differ from each other with equal parity value calculation rules or are equal with different parity value calculation rules, wherein the method includes the steps of calculating the parity value for the two memory columns or the two memory rows according to the calculation rule valid for the corresponding memory column or the corresponding memory row; and comparing the calculated parity values with an expected parity value for the state of integrity.

In accordance with a third aspect, the present invention provides a memory occupation device for a memory having memory cells, which are arranged in memory rows and memory columns and may store binary memory values, wherein the memory occupation device has a unit for determining the memory values to be stored in the corresponding memory cells of the memory, wherein the unit for determining is adapted to determine the memory values such that parity values for two memory rows or for two memory columns differ from each other with the same parity value calculation rule or are equal with different parity value calculation rules; and a writer for writing the memory values determined by the unit for determining into the corresponding memory cells of the memory to occupy the memory.

In accordance with a fourth aspect, the present invention provides a method for occupying memory cells of a memory, which are arranged in memory rows and memory columns in the memory and may store binary memory values, wherein the method has the steps of determining the memory values to be stored in the corresponding memory cells of the memory, wherein the determining is done such that parity values for two memory rows or for two memory columns differ from each other with the same parity value calculation rule or are equal with different parity value calculation rules; and writing the determined memory values into the corresponding memory cells of the memory to occupy the memory.

In accordance with a fifth aspect, the present invention provides a computer program with program code for performing the method for checking a memory having memory cells arranged in memory rows and memory columns and having binary memory values, wherein, in a state of integrity, the memory is occupied such that parity values for two memory rows or for two memory columns differ from each other with equal parity value calculation rules or are equal with different parity value calculation rules, when the computer program runs on a computer, wherein the method includes the steps of calculating the parity value for the two memory columns or the two memory rows according to the calculation rule valid for the corresponding memory column or the corresponding memory row; and comparing the calculated parity values with an expected parity value for the state of integrity.

In accordance with a sixth aspect, the present invention provides a computer program with program code for performing the method for occupying memory cells of a memory, which are arranged in memory rows and memory columns in the memory and may store binary memory values, when the computer program runs on a computer, wherein the method has the steps of determining the memory values to be stored in the corresponding memory cells of the memory, wherein the determining is done such that parity values for two memory rows or for two memory columns differ from each other with the same parity value calculation rule or are equal with different parity value calculation rules; and writing the determined memory values into the corresponding memory cells of the memory to occupy the memory.

In accordance with a seventh aspect, the present invention provides a memory checking device for a memory having memory cells arranged in memory rows and memory columns and having binary memory values, wherein, in a state of integrity, the memory is occupied such that parity values for two memory rows or for two memory columns differ from each other with equal parity value calculation rules or are equal with different parity value calculation rules, wherein the memory checking device includes a reader for reading out the binary memory values of the two memory columns or the two memory rows; and a checking unit adapted to calculate one parity value each for the two memory columns or the two memory rows according to the calculation rule valid for the corresponding memory column or the corresponding memory row, and to compare it with an expected parity value for the state of integrity, and, in the case of a deviation, to provide an indication of an error in one of the memory rows or one of the memory columns to thereby check the memory.

In accordance with an eighth aspect, the present invention provides a method for checking a memory having memory cells arranged in memory rows and memory columns and having binary memory values, wherein, in a state of integrity, the memory is occupied such that parity values for two memory rows or for two memory columns differ from each other with equal parity value calculation rules or are equal with different parity value calculation rules, wherein the method includes the steps of reading out the binary memory values of the two memory columns or the two memory rows; calculating the parity value for the two memory columns or the two memory rows according to the calculation rule valid for the corresponding memory column or the corresponding memory row; comparing the calculated parity values with an expected parity value for the state of integrity; and providing an indication of an error in one of the memory rows or one of the memory columns in the case of a deviation of the calculated parity value from an expected parity value for the state of integrity to thereby check the memory.

The present invention provides a memory checking means for a memory having memory cells arranged in memory rows and memory columns and having binary memory values, wherein, in a state of integrity, the memory is occupied such that parity values for two memory rows or for two memory columns differ from each other with the same parity value calculation rules or are equal with different parity value calculation rules, wherein the memory checking device includes: a reader for reading out the binary memory values of the two memory columns or the two memory rows; and checking means designed to calculate the parity value according to the calculation rule valid for the corresponding memory column or the corresponding memory row for the two memory columns or the two memory rows and to compare it with an expected parity value for the state of integrity, and, in the case of a deviation, to provide an indication of an error in one of the memory rows or one of the memory columns to thereby check the memory.

Furthermore, the present invention provides a method for checking a memory having memory cells arranged in memory rows and memory columns and having binary memory values, wherein, in a state of integrity, the memory is occupied such that parity values for two memory rows or for two memory columns differ from each other with equal parity value calculation rules or are equal with different parity value calculation rules, wherein the method includes: reading out the binary memory values of the two memory columns or the two memory rows; and calculating the parity value for the two memory columns or the two memory rows according to the calculation rule valid for the corresponding memory column or the corresponding memory row, and comparing the calculated parity values with an expected parity value for the state of integrity; providing an indication of an error in one of the memory rows or one of the memory columns in the case of a deviation of the calculated parity value from an expected parity value for the state of integrity to thereby check the memory.

Furthermore, the present invention provides a memory occupation device for a memory having memory cells, which are arranged in memory rows and memory columns and may store binary memory values, wherein the memory occupation device comprises: means for determining the memory values to be stored in the corresponding memory cells of the memory, wherein the means for determining is designed to determine the memory values such that parity values for two memory rows or for two memory columns differ from each other with the same parity value calculation rule or are equal with different parity value calculation rules; and a writer for writing the memory values determined by the means for determining into the corresponding memory cells of the memory to occupy the memory.

Furthermore, the present invention provides a method for occupying memory cells of a memory, which are arranged in memory rows and memory columns in the memory and may store binary memory values, wherein the method comprises: determining the memory values to be stored in the corresponding memory cells of the memory, wherein the determining is done such that parity values for two memory rows or for two memory columns differ from each other with the same parity value calculation rule or are equal with different parity value calculation rules; and writing the determined memory values into the corresponding memory cells of the memory to occupy the memory.

The present invention is based on the finding that an error in an even block may be detected when two row parities for two rows of the considered even block or two column parities for two columns of the considered even block are equal with the same calculation rule for the corresponding row parities or column parities, respectively. This requires that the values stored in the memory cells of the memory were selected such that, in a state of integrity, i.e. in an error-free state of the memory, the corresponding row parities for the considered memory rows differ from each other or the corresponding column parities for the respective memory columns differ from each other. In a preferred embodiment, the two considered rows or the two considered columns of the memory may be arranged directly adjacent to each other. If, for example, a row parity of 1 is determined for a first row, while a row parity of 0 is determined for the directly adjacent row of the memory, an error may be detected in the case of a stuck-at-low error of the even block with the two rows when the two row parities have the binary value of 0. In this case, no binary value of 1 will be contained in this first row for the first row, whereby the row parity for this first row will also be 0. On the other hand, no logic value of 1 will be contained in the second row of the even block affected by a stuck-at-low error either, so that the row parity for the second row also has the value of 0. If, however, a row parity of 1 would have to result for the second row due to a corresponding occupation of the memory values of the memory, an error may thus be detected by the detection of the actual value of the row parity of 0 for the second row. Something analogous also applies to the detection of errors in an even block when this detection is done on the basis of columns and corresponding column parities. Generally speaking, an error in an even block and/or a sub-memory may thus be detected by a corresponding pre-occupation of the memory using different parities for the individual rows of the memory.

Depending on the calculation rule for the corresponding row and/or column parities, an error may also be detected when the two row parities for two rows of the even block to be examined differ from each other. This may, for example, be due to the fact that the row parity for the first row is performed by an EXCLUSIVE-OR operation of the individual memory values stored in the memory cells of the first memory row. For the calculation of the second row parity for the second row, there may, for example, be again performed an EXCLUSIVE-OR operation of the memory values stored in the individual memory cells of the second memory row. Subsequently, however, there may then be done an inversion of the value obtained from the EXCLUSIVE-OR operation of the memory values of the second memory row to obtain the row parity for the second memory row. In this case, the parity calculation rule for the first memory row and the second memory row would differ from each other, whereby an error is detected when the two calculated row parities differ from each other. In this case, the memory would not even have to be occupied differently, but only the calculation rule for the individual row parities in the corresponding rows with the associated evaluation rule has to be considered. Of course, the same argumentation also applies to the detection of errors of an even block using two columns and two corresponding column parities.

BRIEF DESCRIPTION OF THE DRAWINGS

Preferred embodiments of the present invention will be explained in more detail in the following with respect to the accompanying drawings, in which:

FIG. 2 is a tabular representation for the occupation of the memory to be able to implement the inventive approach;

FIG. 3 is a further tabular representation to explain the occupation of the memory necessary to be able to employ the inventive approach;

FIG. 4 is a representation of a derivation for a calculation rule for the occupation of the memory to be able to implement the inventive approach;

FIG. 5 is a representation of a further occupation rule to occupy the memory so that the inventive approach may be employed;

DETAILED DESCRIPTION

Figure 1A:
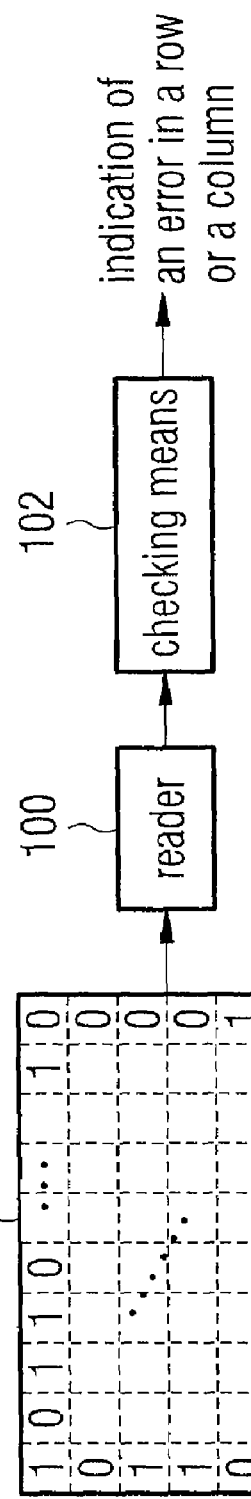
FIG. 1A is a block diagram of an embodiment of the inventive memory checking device.

In the following description of preferred embodiments, like or similar elements are provided with the same or similar reference numerals, wherein a repeated description of these elements is omitted.

FIG. 1 shows a block circuit diagram of an embodiment of the inventive memory checking device. The memory checking device comprises a reader 100 designed to read out binary memory values from two memory columns or from two memory rows of the memory 600. The memory 600 should be occupied with memory values such that the two parities for one of the two memory rows or for one of the two memory columns differ from each other with equal parity calculation rules or are equal with different parity calculation rules. The memory values of the memory 600 read out by the reader 100 are then transmitted to the checking means 102 designed to calculate one parity value each according to the parity calculation rule valid for the corresponding memory columns or memory rows for the two memory columns or the two memory rows, and to compare it with an expected parity for the state of integrity, and, in the case of a deviation, to provide an indication of an error in one of the rows or one of the columns to thereby check the memory.

This indication of an error in one of the rows or one of the columns may then be output as an output signal of the checking means 102.

Figure 1B:
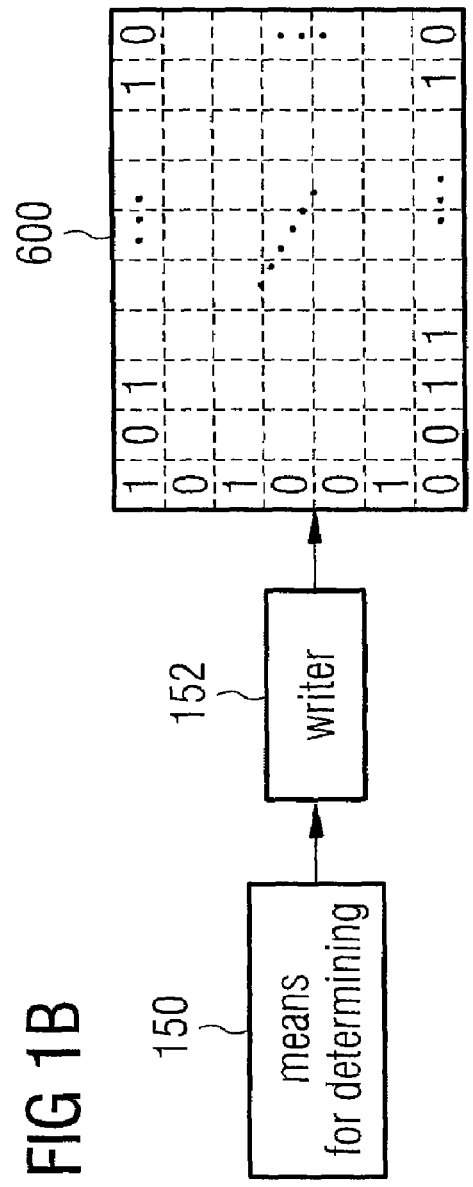
FIG. 1B is a block circuit diagram of an embodiment of the inventive memory occupation device.
Figure 6:
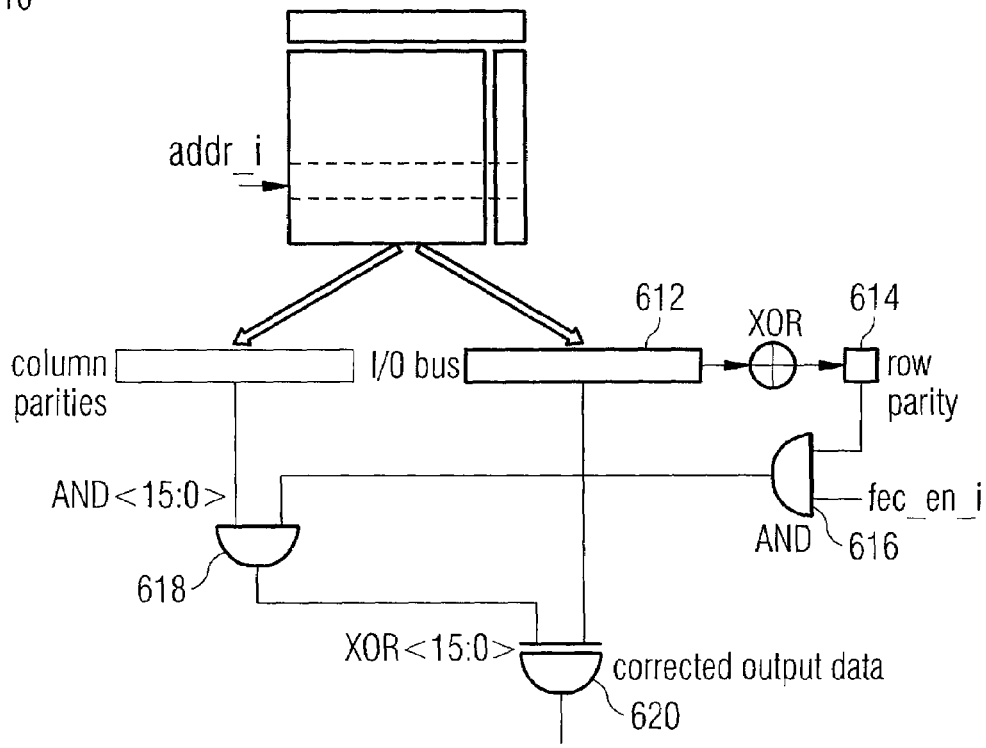
FIG. 6 is a representation of a memory occupation according to a conventional approach and a representation of a block diagram for the correction of a single bit error in the occupation of the memory.
Figure 7:
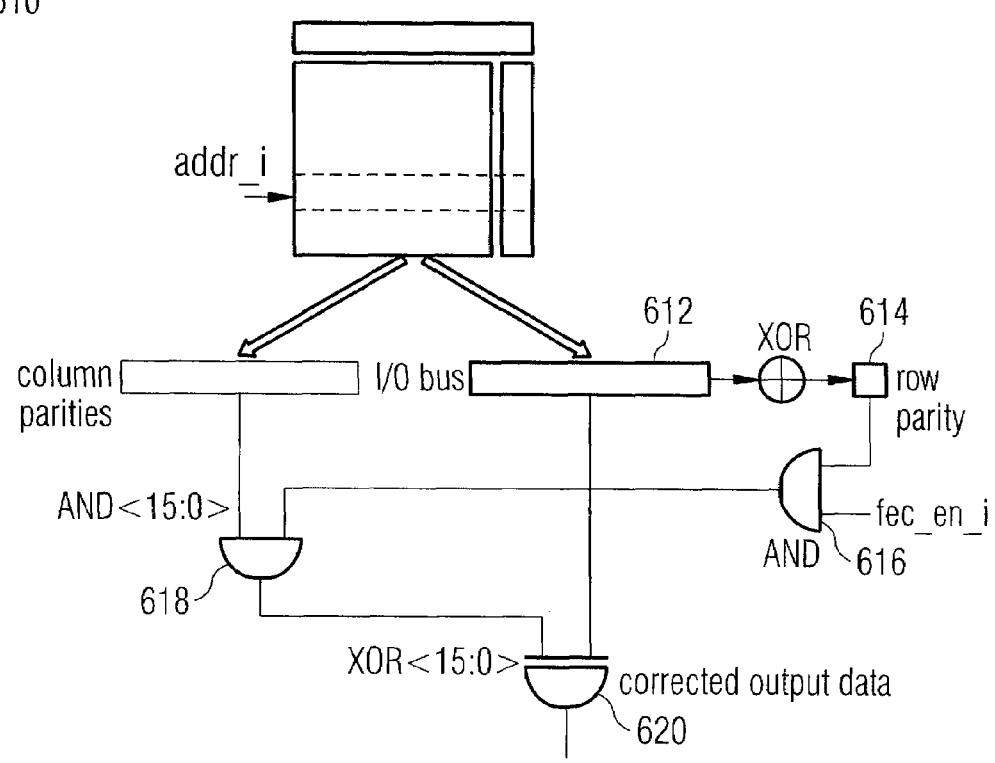
FIG. 7 is a representation of how the occurrence of a single bit error in the memory affects the corresponding column and row parities and a block diagram for the correction of a correspondingly occurred single bit error.

FIG. 1B illustrates a block circuit diagram of an embodiment of the inventive memory occupation device. The memory occupation device includes means 150 for determining the memory values to be stored in corresponding memory cells of the memory 600. The means 150 for determining is designed to determine the memory values such that parities for two memory rows or for two memory columns differ from each other with equal parity calculation rules or are equal with different parity calculation rules. The determined memory values are subsequently transmitted from the means 150 for determining to a writer 152 by which the memory values determined by the means 150 are written into the corresponding memory cells of the memory 600 to occupy the memory 600.

Here, it is to be noted that the memory occupation device, such as it is illustrated in FIG. 1B, may preferably be used at the factory to write to the memory prior to the delivery to an end user or a vendor. Prior to the delivery of the memory 600, this may thus ensure that the memory is occupied according to the desired parity mask, whereby a failure of memory parts and/or even blocks may be detected. In contrast, the memory checking device, such as it is illustrated in FIG. 1A, may be used on the user side, for example in an automobile, when the memory 600 is used as memory for calibrating values of a sensor in automobile electronics. However, the memory checking device may also be used at the factory, for example in connection with a corresponding memory occupation device or when the memory checking device further includes a writer for writing in memory values. This offers the advantage to perform, prior to writing to the memory 600, a check whether the memory 600 is already written to or whether individual even blocks are faulty. As field of application of such an extended memory occupation device, there would be conceivable, for example, the use of such a memory occupation device that could be employed in automobile garages for reprogramming the sensor calibrating measurement value memory when the memory is used for storing calibrating measurements values of an automobile electronics sensor.

The following will explain the basic idea of the present invention in more detail. Unlike the conventional approach to use an even parity, i.e. a parity signal with a single logic value (always 0 or always 1) for all rows and columns, the core of the present invention is to provide different columns and/or different rows with different parities when a calculation rule for the parities is identical, or to occupy the corresponding rows and/or columns of the memory such that the result are equal parities when the parity calculation rule for the rows and/or columns is different. For example, a sequence of alternating parities may be used such that columns with even column number, i.e. the columns 0, 2, 4, 6, . . . are provided with even parity, whereas columns with odd column number, i.e. the columns 1, 3, 5, . . . are provided with odd parity. What is referred to as even parity is a state in which an even number of ones is entered in the respective row/column, whereas what is referred to as odd parity is a state in which the parity has a logic state of 1. In order to achieve such a memory occupation, a parity mask is provided that associates a parity mask bit with each column, as has been done in FIG. 2 by the parity mask 200.

FIG. 2 shows a memory having 16 columns and 6 rows. The columns are provided with column numbers in the top row. The rows are provided with row numbers in the column on the very right. In the second row, the alternating bits of the parity mask are entered in bold characters, which define that the columns 15, 13, . . . , one are to be calculated with even parity and the columns 14, 12, . . . , 2, 0 are to be calculated with odd parity. Column 15 and row 5 are again the parity bits stored in the memory itself, which are chosen so that, for example, in column 15 the number of ones is even, whereas it is odd in column 14.

If the parity mask bit is equal to 1, the column is provided with odd parity; if the parity mask bit is equal to 0, the column is calculated with even parity. This alteration with respect to prior art does not require any additional chip area, because the EXOR gates (EXOR=EXCLUSIVE OR) of address 0 present in the memory matrix are applied to the value of the bit with one input and to the value of the parity mask with the second input. In contrast, the second input in prior art is always on the logic value LOW. As an example, there may be illustrated by way of formula the determination of the memory entries for the fifth column:

Column parity <5>=parity mask <5> $\oplus$ bit (address 0, column 5) $\oplus$ bit (address 1, column 5) $\oplus$ . . . $\oplus$ bit (address 5, column 5).

If there is a defect in the whole memory, so that all bits are read out to 0, this is detected in the calculation of the column parity of the columns 14, 12, 10, . . . , 2, 0, because the number of ones in these columns does not have an odd value, because all bits have the binary value 0. Even if only a single column fails with "stuck-at-low", this is detected as long as the column has an even number (i.e. an odd parity). However, odd columns are not detected in that way. Homogeneous blocks of "stuck-at-low" failures, however, are sure to be detected when they involve at least two columns.

The case is similar when a column fails due to a "stuck-at-high" error, because this is detected for odd columns (i.e. for those with even parity), but not for single columns with odd parity, but is detected when homogeneous blocks of at least two columns fail. This alternating parity coding is thus rather powerful, because it detects all failures of two or more (preferable adjacent) columns and half of all possible failures of single columns.

There may also further be performed a detection of defect rows in an analogous way, as it is possible by means of the parity mask for the columns. For this, a corresponding parity mask for the corresponding rows would have to be used analogously.

In order to be able to simultaneously also detect failures of rows besides failures of columns, the concept introduced above may also be extended such that both columns and rows are provided with alternating parity. Such an approach is illustrated by way of example in tabular form in FIG. 3, wherein a parity mask 300 for the rows is also used in addition to the parity mask 200 for the columns. The top row of the memory, indicated by the reference numeral 302 in FIG. 3, for example, has a parity mask with a binary value of 1 and is thus calculated with odd parity, i.e. the number of ones in this row has to be odd. However, only the programmed bits including the parity bit in column 15 count for this, i.e. the logic value of 1 of the parity mask is excluded. If two or more adjacent rows show "stuck-at-high" or "stuck-at-low" failures, this is detected by the incorrect parity. A single row is detected when it shows a stuck-at-low failure and is to have odd parity at the same time (wherein in this case there is always indicated an error) and/or when it shows a "stuck-at-high" failure and, at the same time, is to have even parity, which is only satisfied for an odd number of bits in a row. In the case of an even number of bits in a row, the parity is even for stuck-at-high errors, wherein in that case no error can be detected based on the parity of the corresponding row. For generalization, this may be represented as follows: If the parity mask is 1, a stuck-at-low error is sure to be detected; a stuck-at-high error, however, is only detected in the case of an even number of bits in the corresponding row/column, but not in the case of an odd number. If the value of the parity mask in the corresponding row/column is 0, a stuck-at-low error in this row/column alone is detectable neither for an even nor an odd number, but a stuck-at-high error is detected for an odd, but not for an even number.

The alternating row parity calculation may again be realized in a very simple and inexpensive way by also adding the inverted LSB (least significant bit) of the row address in the modulo 2 addition of all bits of a row. This may be illustrated by the following formula:

row parity=NOT (address <0> $\oplus$ bit <0> $\oplus$ bit <1> $\oplus$ . . . $\oplus$ bit <15>.

However, the row parity mask and the column parity mask cannot be selected arbitrarily, but have to be coordinated with each other. This is described in more detail in the following with respect to FIGS. 4 and 5. Essentially, the coordination of the row parity mask and the column parity mask concerns the field in the cross point of the row and column parities. This parity bit may be calculated in two ways. On the one hand, it has to satisfy the parity condition of the row, on the other hand the parity condition of the column. Both conditions may not contradict each other. That can only be achieved when the parity masks follow the conditions derived below.

In FIG. 4, the top part illustrates a first case for a memory comprising an even number of columns and an odd number of rows. The field that may be occupied by user data bits is indicated by hatching from bottom left to top right. On the right side, the column parity mask is illustrated, which is indicated by hatching from top left to bottom right. On the left side, column no. 15 is formed as column parity and indicated by vertical hatching. Those bits are stored into the memory cells of columns 15 that are necessary in an EXCLUSIVE-OR operation of the user data bits for a row to achieve the corresponding bit (i.e. c or d) of the column parity mask. Furthermore, those binary values are stored into the memory cells of row 6 that are necessary in an EXCLUSIVE-OR operation of the memory values of the individual columns to achieve the values a or b of the corresponding row parity mask, as illustrated in the top row of the upper part of FIG. 4. It can be seen from the schematic representations in portion 400 of FIG. 4 how the individual values in the corresponding fields are calculated, wherein the sign $\oplus$ symbolizes a modulo 2 addition. The result is that, in the case of an even number of columns and an odd number of rows, the parity mask for the parity row has to have the logic value 1, i.e. that the value has to be c=1.

The lower part of FIG. 4 illustrates the case in which the memory comprises an even number of columns and an even number of rows. In this case, the calculation has the result that there is no constraint for the parity masks for an even number of columns and rows, i.e. that both the logic values 1 or 0 are possible for the values a and b, and c and d, but with the limitation that a and b differ from each other and c and d also differ from each other.

With respect to a third case in which the memory has an odd number of columns and an even number of rows, the above calculation has the result that the parity mask in the parity column has to have a logic value of 1. This has the result that the variable b has to assume a logic value of 1. Such a case is illustrated in the upper part in FIG. 5.

In FIG. 5, the lower part finally illustrates the fourth case in which a memory has an odd number of columns and an odd number of rows. The calculation with respect to the fourth case has the result that a solution may only be found when the variable a has a value equal to the value of the variable d, and, at the same time, the variable b has a value identical to the value of the variable c. This means that either a=1, b=0, c=0 and d=1, or a=0, b=1, c=1 and d=0.

This results in the general rule that the parity mask in the parity row and in the parity column should assume a logic value 1. This works for all four different cases, as illustrated above. Other solutions are also possible for individual variants—as derived in detail above, they do not work, however, for all four cases at the same time.

The row parity does not have to be in the uppermost address either, but may, for example, also be on the address 3 or any other address in the memory. The column parity also does not have to be in the most significant column, but may, for example, also be entered in column 8 or any other column.

Finally, it can be noted that a possible lock bit for blocking a write operation to the memory should preferably be placed in rows with a certain parity. A lock bit is provided for irreversibly locking the memory after programming the lock bit, so that, for example, no unintentional reprogramming can be performed after the calibration of the sensor. If such a lock bit is to lock for a logic value of 1 (i.e. is to be high active), it should be in a row having an odd parity and should also be located in a column also having an odd parity. Alternatively, the lock bit may also only be located in a row having odd parity and may not be located in a column having odd parity, wherein in that case there is only a protection against a failure of the respective row, but not a protection against the failure of the corresponding column. Something analogous also applies to the arrangement of the lock bit in a corresponding column having odd parity and a row not having odd parity. Thus, if later on a whole row or column fails (i.e. has a stuck-at-low or a stuck-at-high error), this failure will be detected if the row and/or column only has a binary value of 0 in the memory cells (i.e. if the memory were not write-protected). However, if a stuck-at-high error occurs in the corresponding row or column, this would have the result that the integrated circuit is considered to be write-protected and at least cannot be reprogrammed unintentionally any more. Something analogous also applies the other way round, i.e. if a lock bit is to lock for a binary value of 0 (i.e. is to be low active), it should be in a row and column that both have even parity and an odd number of cells per column/row.

Depending on the circumstances, the inventive method for checking a memory or the method for occupying a memory may be implemented in hardware or in software. The implementation may be done on a digital storage medium, particularly a floppy disk or a CD with control signals that may be read out electronically, which may cooperate with a programmable computer system so that the corresponding method is executed. Generally, the invention thus also consists in a computer program product with a program code stored on a machine-readable carrier for performing the inventive method when the computer program product runs on a computer. In other words, the invention may thus be realized as a computer program with a program code for performing the method, when the computer program runs on a computer.

In summary, it may be noted that the invention essentially consists in extending a matrix parity check by associating alternating and/or at least two different parity values with the columns and/or rows. This makes it possible to detect failures of whole rows and whole columns. Such a parity value distribution is implemented by, for example, adding a parity mask modulo 2 to the sum of the column bits and adding the inverted or non-inverted LSB of the address to the sum of the row bits modulo 2.

Furthermore, a high active lock bit may also be accommodated in a row and column with odd parity, or a low active lock bit may be accommodated in a row and/or column with even parity.

The core of the present invention is thus that the parity mask contains both ones and zeros for the same calculation rule or contains equal values for a different calculation rule. Preferably, these values and/or calculation rules may be alternately allocated to consecutive rows/columns. In the described example, the row with the address 0 was chosen as parity row, the column 15 was chosen as parity column. In contrast, the term "row parity" refers to the result of the calculation of the parity of, for example, a whole row (including the parity bit in this row). Analogously, the term "column parity" refers to the result of the calculation of, for example, a whole column including the parity bit in the corresponding column.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A memory checking device for a memory having memory cells arranged in memory rows and memory columns and having binary memory values, wherein each of the memory rows has associated therewith a row parity bit, wherein the row parity bits are chosen such that, in a state of integrity, the memory rows have alternately different parity values when egual parity value calculation rules are used, or have equal parity values when alternately different parity value calculation rules are used, wherein the memory checking device comprises:

a checking unit adapted to calculate one parity value each for the memory rows according to the calculation rule valid for the corresponding memory row, and to compare them with expected parity values for the state of integrity.

2. The memory checking device of claim 1, wherein each of the memory columns has associated therewith a column parity bit, wherein the column parity bits are chosen such that, in the state of integrity, the memory columns have alternately different parity values when equal parity value calculation rules are used, or equal parity values when alternately different parity value calculation rules are used, wherein the checking unit is adapted to calculate one parity value each for the memory columns according to the calculation rule valid for the corresponding memory column and to compare them with expected parity values for the state of integrity.

3. The memory checking device of claim 2, wherein, in the state of integrity of the memory, the parity values for consecutive memory rows or for consecutive memory columns are set by a parity value mask, wherein the parity value mask is a sequence alternately comprising the binary values zero and one, and wherein the checking unit is adapted to calculate the parity values for consecutive memory rows or for consecutive memory columns and to provide an indication of an error in one of the memory rows or one of the memory columns when the calculated parity values for the consecutive memory rows or for the consecutive memory columns do not correspond to the parity values of the respective parity mask.

4. The memory checking device of claim 3, further comprising a
  reader adapted to read out the memory rows and the memory columns,
  wherein the checking unit is adapted to provide an indication of an error in one of the memory rows and one of the memory columns when the calculated parity values do not correspond to the corresponding expected parity values for the state of integrity.

5. The memory checking device of claim 1, wherein the checking unit is adapted to perform a modulo two addition or an EXCLUSIVE-OR operation in the parity value calculation.

6. The memory checking device of claim 2, wherein the checking unit is adapted to use a bit of a memory address for a memory row or a memory column in the calculation of a parity value.

7. The memory checking device of claim 1, wherein the memory has a memory capacity of at the most 1000 bits, wherein the reader is adapted to be able to read out a memory of the size of at the most 1000 bits.

8. The memory checking device of claim 1, wherein, in the state of integrity, the memory comprises a binary memory value of one in a protection memory cell in a predefined memory row and a predefined memory column in the memory to provide information that the contents of the memory cells of the memory may not be overwritten, wherein, in the state of integrity, the memory comprises a binary parity value of one in the predefined memory row or a binary parity value of one in the predefined memory column at the same time, and
  wherein a reader is adapted to read out the predefined memory row or the predefined memory column including the protection memory cell, and wherein the checking unit is adapted to calculate the parity value for the predefined memory row or the predefined memory column, wherein the device further includes:
  a writer for writing memory values into the memory, wherein the writer is adapted to perform the writing of memory values into the memory when there is no indication of an error in the predefined memory row or the predefined memory column and a calculated binary parity value of zero for the predefined memory row or the predefined memory column, and not to perform the writing of memory values into the memory when there is an indication of an error in the predefined memory row or the predefined memory column.

9. The memory checking device of claim 1, wherein, in the state of integrity, the memory comprises a binary memory value of zero in a protection memory cell in a predefined memory row and a predefined memory column in the memory to provide information that the contents of the memory cells of the memory may not be overwritten, wherein, in the state of integrity, the memory comprises a binary parity value of zero in the predefined memory row or a binary parity value of zero in the predefined memory column at the same time, and
  wherein a reader is adapted to read out the predefined memory row or the predefined memory column including the protection memory cell, and wherein the checking unit is adapted to calculate the parity value for the predefined memory row or the predefined memory column, wherein the device further includes:
  a writer for writing memory values into the memory, wherein the writer is adapted to perform the writing of memory values into the memory when there is no indication of an error in the predefined memory row or the predefined memory column and a calculated binary parity value of one for the predefined memory row or the predefined memory column, and not to perform the writing of memory values into the memory when there is an indication of an error in the predefined memory row or the predefined memory column.

10. A memory checking device for a memory having memory cells arranged in memory rows and memory columns and having binary memory values, wherein each of the memory columns has associated therewith a column parity bit, wherein the column parity bits are chosen such that, in a state of integrity, the memory columns have alternately different parity values when equal parity value calculation rules are used, or have equal parity values when alternately different parity value calculation rules are used, wherein the memory checking device comprises:
  a checking unit adapted to calculate one parity value for each of the memory columns according to the calculation rule valid for the corresponding memory column, and to compare them with expected parity values for the state of integrity.

11. A method for checking a memory having memory cells arranged in memory rows and memory columns and having binary memory values, wherein each of the memory rows has associated therewith a row parity bit, wherein the row parity bits are chosen such that, in a state of integrity, the memory rows have alternately different parity values when equal parity value calculation rules are used, or have equal parity values when alternately different parity value calculation rules are used, wherein the method includes:
  calculating the parity value for the memory rows according to the calculation rule valid for the corresponding memory row; and
  comparing the calculated parity values with an expected parity value for the state of integrity.

12. The method of claim 11, wherein each of the memory columns has associated therewith a column parity bit, wherein the column parity bits are chosen such that, in the state of integrity, the memory columns have alternately different parity values when equal parity value calculation rules are used, or equal parity values when alternately different parity value calculation rules are used, wherein the step of calculating comprises calculating one parity value each for the memory columns according to the calculation rule valid for the corresponding memory column and wherein the step of comparing comprises comparing the parity values for the columns with expected parity values for the state of integrity.

13. The method of claim 12, further comprising:
  reading out the binary memory values of the two memory columns or the two memory rows; and providing an indication of an error in one of the memory rows or one of the memory columns in the case of a deviation of the calculated parity value from an expected parity value for the state of integrity to thereby check the memory.

14. A memory occupation device for a memory having memory cells, which are arranged in memory rows and memory columns and may store binary memory values, wherein each of the memory rows has associated therewith a row parity bit and each of the memory columns has associated therewith a column parity bit, wherein the memory occupation device comprises:

a unit for determining the memory values to be stored in the corresponding memory cells of the memory and for determining the row parity bits and the column parity bits, wherein the unit for determining is adapted to determine the row parity bits and the column parity bits depending on the memory values such that the memory rows have alternately different parity values and the memory columns have alternately different parity values when equal parity value calculation rules are used, or the memory rows have equal parity values and the memory columns have equal parity values when different parity value calculation rules are used; and a writer for writing the memory values, the row parity bits and the column parity bits determined by the unit for determining into the corresponding memory cells of the memory to occupy the memory.

15. The memory occupation device of claim 14, wherein the unit for determining is adapted to determine memory values for memory cells of consecutive memory rows or memory values for memory cells of consecutive memory columns such that parity values for the consecutive memory rows or the consecutive memory columns are set by a parity value mask, wherein the parity value mask is a sequence alternately comprising the binary values 0 and 1.

16. The memory occupation device of claim 14, wherein the unit for determining is adapted to perform a modulo two addition or an EXCLUSIVE-OR operation of memory values to be written into memory cells with a parity value that a memory row or a memory column is to have in the state of integrity of the memory, when determining the memory values for the memory cells.

17. The memory occupation device of claim 14, wherein the unit for determining is adapted to use a bit of a memory address for a memory row or a memory column when determining a memory value for a memory cell.

18. The memory occupation device of claim 14, wherein the unit for determining is adapted to determine the row parity bit of a memory row by means of a combination of a parity value associated with the memory row and the memory values of to be written into the corresponding memory row, and to determine the column parity bit of a memory column by means of a combination of a parity value associated with the memory column and the memory values to be written into the corresponding memory column.

19. The memory occupation device of claim 18, wherein the unit for determining is adapted to arrange the row parity bits in a common memory column and to arrange the column parity bits in a common memory row.

20. The memory occupation device of claim 19, wherein the unit for determining is adapted to determine the memory values to be written into the memory cells of the memory such that the parity value for the common memory column and the parity value for the common memory row is a binary value of one, respectively.

21. The memory occupation device of claim 14, wherein the unit for determining is adapted to allocate a binary memory value of one to a protection memory cell of the memory arranged in a predefined memory row and in a predefined memory column to provide information that the contents of the memory cells of the memory may not be overwritten, and wherein the unit for determining is further adapted to determine the memory values of the memory cells in the predefined memory row such that the parity value of the predefined memory row has a binary value of one, or to determine the memory values of the memory cells in the predefined memory column such that the parity value of the predefined memory column has a binary value of one.

22. The memory occupation device of claim 14, wherein the unit for determining is adapted to allocate a binary memory value of zero to a protection memory cell of the memory arranged in a predefined memory row and in a predefined memory column to provide information that the contents of the memory cells of the memory may not be overwritten, and wherein the unit for determining is further adapted to determine the memory values of the memory cells of the predetermined memory row such that the parity value of the predefined memory row has a binary value of zero, or to determine the memory values of the memory cells in the predefined memory column such that the parity value of the predefined memory column has a binary value of zero.

23. A method for occupying memory cells of a memory, which are arranged in memory rows and memory columns in the memory and may store binary memory values, wherein each of the memory rows has associated therewith a row parity bit and each of the memory columns has associated therewith a column parity bit, wherein the method comprises:

determining the memory values to be stored in the corresponding memory cells of the memory and for determining the row parity bits and the column parity bits depending on the memory values such that the memory rows have alternately different parity values and the memory columns have alternately different parity values when equal parity value calculation rules are used, or the memory rows have equal parity values and the memory columns have equal parity values when alternately different parity value calculation rules are used; and writing the determined memory values, the row parity bits and the column parity bits into the corresponding memory cells of the memory to occupy the memory.

24. A computer readable storage medium formatted as program code executable on a computer used for performing the method of claim 23.

25. A method for checking a memory having memory cells arranged in memory rows and memory columns and having binary memory values, wherein each of the memory columns has associated therewith a column parity bit, wherein the column parity bits are chosen such that, in a state of integrity, the memory columns have alternately different parity values when equal parity value calculation rules are used, or have equal parity values when alternately different parity value calculation rules are used, wherein the method includes:

calculating the parity value for the memory columns according to the calculation rule valid for the corresponding memory column; and comparing the calculated parity values with an expected parity value for the state of integrity.

* * * * *